(12) United States Patent
Kim et al.

(10) Patent No.: US 9,475,986 B2
(45) Date of Patent: *Oct. 25, 2016

(54) RED PHOSPHOR AND LIGHT-EMITTING DEVICE COMPRISING THE SAME

(76) Inventors: Do-Hwan Kim, Buk-gu Gwangju (KR); Sang-Hyun Kim, Seoul (KR); Chul-Soo Yoon, Suwon-si (KR)

(*) Notice: Subject to any disclaimer, the term of this patent is extended or adjusted under 35 U.S.C. 154(b) by 132 days.

This patent is subject to a terminal disclaimer.

(21) Appl. No.: 14/118,336

(22) PCT Filed: May 18, 2012

(86) PCT No.: PCT/KR2012/003971
§ 371 (c)(1),
(2), (4) Date: Nov. 18, 2013

(87) PCT Pub. No.: WO2012/157997
PCT Pub. Date: Nov. 22, 2012

(65) Prior Publication Data
US 2014/0077687 A1    Mar. 20, 2014

(30) Foreign Application Priority Data

May 19, 2011  (KR) .................. 10-2011-0047508

(51) Int. Cl.
*C09K 11/64*   (2006.01)
*H01L 33/00*   (2010.01)
*C09K 11/77*   (2006.01)
*C09K 11/08*   (2006.01)
(Continued)

(52) U.S. Cl.
CPC ........ *C09K 11/7728* (2013.01); *C09K 11/0883* (2013.01); *C09K 11/7734* (2013.01); *C09K 11/7739* (2013.01); *H05B 33/12* (2013.01); *H01L 33/502* (2013.01); *H01L 2224/48247* (2013.01); *H01L 2224/48257* (2013.01); *H01L 2924/181* (2013.01)

(58) Field of Classification Search
CPC .......... C09K 11/0883; C09K 11/7706; C09K 11/7734; H01L 33/502; H01L 33/504
See application file for complete search history.

(56) References Cited

U.S. PATENT DOCUMENTS 7,184,111 B2 *  2/2007  Chua et al. ................. 349/71
7,187,011 B2 *  3/2007  Tasch et al. ............... 257/103
(Continued)

FOREIGN PATENT DOCUMENTS

CN    101195744    6/2008
JP    2008189700   8/2008
(Continued)

OTHER PUBLICATIONS

Chinese Office Action dated Oct. 10, 2014, issued in Chinese Application No. 201280035991.6.
(Continued)

*Primary Examiner* — Carol M Koslow
(74) *Attorney, Agent, or Firm* — Onello & Mello, LLP

(57) ABSTRACT

There is provided a red phosphor including a compound represented by an empirical formula $A_z(Sr,M)_2(Si,Al)O_{4-x}N_y$:R(0<x<3, y=2x/3, and 0.0001≤z<0.1), and has a grain size distribution corresponding to 6.9 μm≤D50≤13.9 μm, wherein M and Al are optional, A is at least one element selected from a group consisting of lithium (Li), potassium (K) and sodium (Na), and M is at least one element selected from a group consisting of Barium (Ba), magnesium (Mg) and calcium (Ca).

19 Claims, 6 Drawing Sheets

(51) Int. Cl.
*H05B 33/12* (2006.01)
*H01L 33/50* (2010.01)

(56) References Cited

U.S. PATENT DOCUMENTS

| | | | |
|---|---|---|---|
| 7,443,094 B2 * | 10/2008 | Sakane et al. | 313/503 |
| 8,153,023 B2 | 4/2012 | Shioi | |
| 9,035,340 B2 * | 5/2015 | Kim et al. | 257/98 |
| 2009/0251044 A1 | 10/2009 | Shioi | |
| 2009/0284948 A1 | 11/2009 | Yamao et al. | |
| 2010/0053932 A1 | 3/2010 | Emoto et al. | |
| 2011/0096560 A1 | 4/2011 | Ryu et al. | |
| 2013/0001815 A1 | 1/2013 | Yamao et al. | |
| 2013/0248909 A1 | 9/2013 | Kim et al. | |

FOREIGN PATENT DOCUMENTS

| | | | |
|---|---|---|---|
| KR | 1020090026308 | | 3/2009 |
| KR | 1020090026317 | | 3/2009 |
| KR | 1020100120616 | | 11/2010 |
| KR | 20120030286 | * | 3/2012 |
| KR | 1020120030286 | | 3/2012 |

OTHER PUBLICATIONS

International Preliminary Report on Patentability in corresponding PCT Application KR2012/003971.
International Search Report and Written Opinion of PCT/KR2012/003971 dated Dec. 12, 2012.

* cited by examiner

RED PHOSPHOR AND LIGHT-EMITTING DEVICE COMPRISING THE SAME

TECHNICAL FIELD

Aspects of embodiments relate to a red phosphor and a light emitting device including the same, and more particularly, to a red phosphor having excellent light emission characteristics as well as thermal and chemical stability, and a light emitting device including the same.

BACKGROUND ART

Since light emitting diodes (LEDs) have many positive attributes such as high reliability, relatively long lifespans, relatively low maintenance costs, and relatively low power consumption, LEDs may contribute to reductions in energy usage. Further, as illumination devices, LEDs may be usefully used while having various designs applied thereto and generating relatively low levels of heat.

Phosphor materials used in devices including the LEDs as described above or the like are materials converting specific wavelengths of light provided from various light sources into wavelengths of light required thereof, and have been recognized as a core technology in the forming of white LEDs. In addition, phosphor material efficiency acts as a principal factor directly relevant to efficiency in light source products including display devices, simultaneously with being necessary for driving display devices. Recently, research into a technology for implementing white light having properties close to those of natural light has been making progress and research into white LED devices for emitting such white light has been actively conducted.

In general, white LEDs have been manufactured in a scheme in which at least one or more phosphors selected from red phosphors, blue phosphors, yellow phosphors and the like are applied to blue or ultraviolet LED chips. For example, when red phosphors are combined with phosphors exhibiting a different color in the case of the use thereof, in a case in which a full width at half maximum of a respective phosphor is relatively low, it may be difficult to secure a sufficient color rendering index. Further, there may be limitations in implementing white light having required properties, close to those of natural light.

In addition, in the case of red phosphors according to the related art, a full width at half maximum thereof has a relatively low level, and a light emission peak is provided within a light wavelength band of 550 to 700 nm such that it may be difficult to exhibit a sufficient color rendering index. Therefore, the development of red phosphors capable of implementing a sufficient color rendering index while having high light emission efficiency has been in demand.

DISCLOSURE

Technical Problem

An aspect of an embodiment provides a red phosphor having relatively high brightness and excellent thermal and chemical stability and a light emitting device including the same.

Technical Solution

An aspect of an embodiment provides a red phosphor including: a compound represented by an empirical formula $A_z(Sr,M)_2(Si,Al)O_{4-x}N_y$:R ($0<x<3$, $y=2x/3$, and $0.0001 \leq z<0.1$), wherein M and Al are optional and, if present, the amount of M and Al is equal to or greater than 0.1 mol % and less than or equal to 0.6 mol %, A is at least one element selected from a group consisting of lithium (Li), potassium (K) and sodium (Na), and M is at least one element selected from a group consisting of Barium (Ba), magnesium (Mg) and calcium (Ca); and a grain size distribution corresponding to $6.9 \ \mu m \leq D50 \leq 13.9 \ \mu m$.

The red phosphor may have a grain size distribution corresponding to $D90-D50 \leq 14.7 \ \mu m$.

A may be sodium (Na) and M may be calcium (Ca).

The compound represented by the empirical formula $A_z(Sr,M)_2(Si,Al)O_{4-x}N_y$:R ($0<x<3$, $y=2x/3$, and $0.0001 \leq z<0.1$) may be formed of a host material having a crystalline phase, and A may be a dopant material or an activator in the compound.

The compound represented by the empirical formula $A_z(Sr,M)_2(Si,Al)O_{4-x}N_y$:R ($0<x<3$, $y=2x/3$, and $0.0001 \leq z<0.1$) may be formed of a host material having a crystalline phase, and the A and the aluminum may be dopant materials or activators in the compound.

The red phosphor may have a light emission peak in a light wavelength band of 600 nm to 700 nm by using a blue or ultraviolet wavelength region as a source of excitation.

The red phosphor may further include europium (Eu) or dysprosium (Dy), as an activator.

A spectral full width at half maximum of a light emission wavelength of the red phosphor may range from 83 to 150 nm.

The red phosphor may have an orthorhombic crystal structure.

An aspect of an embodiment provides a light emitting device including: a light emitting element emitting excitation light; and a wavelength converting unit absorbing the excitation light to emit visible light, wherein the wavelength converting unit includes a compound represented by an empirical formula $A_z(Sr,M)_2(Si,Al)O_{4-x}N_y$:R ($0<x<3$, $y=2x/3$, and $0.0001 \leq z<0.1$) and has a grain size distribution corresponding to $6.9 \ \mu m \leq D50 \leq 13.9 \ \mu m$, wherein M and Al are optional and, if present, the amount of M and Al is equal to or greater than 0.1 mol % and less than or equal to 0.6 mol %, A is at least one element selected from a group consisting of lithium (Li), potassium (K) and Sodium (Na), M is at least one element selected from a group consisting of barium (Ba), magnesium (Mg) and calcium (Ca), and R is at least one element selected from a group consisting of lanthanoid and a transition metal element.

The light emitting device may have a grain size distribution corresponding to $D90-D50 \leq 14.7 \ \mu m$.

The red phosphor may emit a light emission peak of light in a light wavelength band of 600 nm to 700 nm by using a blue or ultraviolet wavelength region as a source of excitation.

The light emitting element may be an ultraviolet light emitting diode or a blue light emitting diode.

The light emitting device may include at least one type of phosphor selected from a group consisting of a blue phosphor, a green phosphor and a yellow phosphor, and the light emitting device may ultimately output white light.

The wavelength converting unit may be formed above the light emitting element and may have a multi-layer structure configured of at least two phosphor layers including different types of phosphors.

The phosphor may be at least one selected from a group consisting of a blue phosphor, a green phosphor and a yellow phosphor, and the light emitting device may ultimately output white light.

The wavelength converting unit may be formed such that an outer surface of the light emitting element is uniformly covered with a resin including the red phosphor.

The wavelength converting unit may only be formed on an upper surface of the light emitting element or may be formed on an upper surface and sides thereof.

The wavelength converting unit may further include a resin encapsulation unit encapsulating the light emitting element, and the red phosphors may be distributed in the resin encapsulation unit.

The wavelength converting unit may include at least two types of phosphors selected from a group consisting of a blue phosphor, a green phosphor and a yellow phosphor, and the light emitting device may ultimately output white light.

Advantageous Effects

According to an embodiment, a red phosphor capable of emitting long wavelength red light having relatively high light emission characteristics and excellent thermal and chemical stability may be provided. In addition, as a red phosphor is included as described above, a light emitting device capable of emitting white light having properties close to those of natural light by using light in blue and ultraviolet light wavelength bands as sources of excitation while having high output and reliability characteristics may be provided.

DESCRIPTION OF DRAWINGS

The above and other aspects, features and other advantages will be more clearly understood from the following detailed description taken in conjunction with the accompanying drawings, in which.

BEST MODE FOR INVENTION

Figure 1:
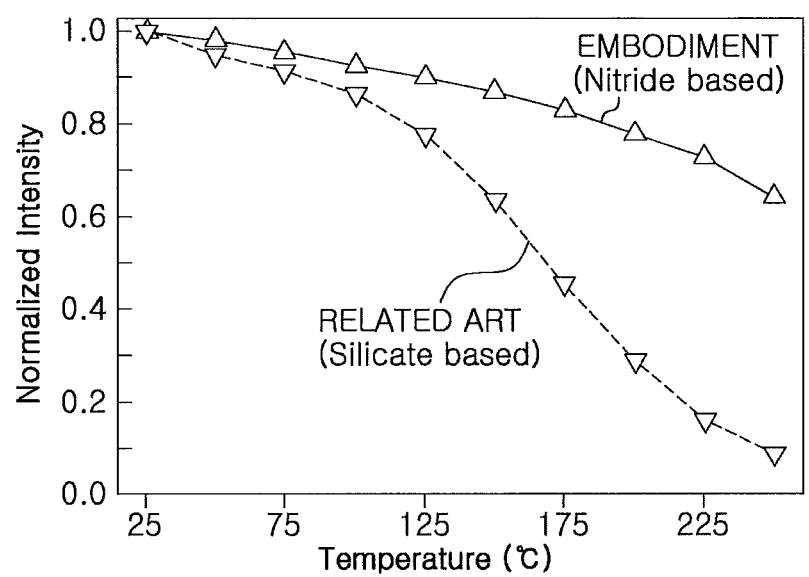
FIG. 1 is a graph illustrating, as T/Q properties, quality properties of a silicate-based phosphor according to the related art and a nitride-based phosphor according to an embodiment of the inventive concept, depending on a temperature.

Hereinafter, embodiments will be described in detail with reference to the accompanying drawings.

Embodiments may, however, be embodied in many different forms and should not be construed as being limited to embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity.

A red phosphor according to an embodiment may include a compound represented by an empirical formula $A_z(Sr,M)_2(Si,Al)O_{4-x}N_y:R$ ($0<x<3$, $y=2x/3$, $0.0001 \leq z<0.1$), wherein M and Al are optional and, if present, M is Ca or Mg wherein if M is Ca, the amounts of Ca and Al are equal and in a range of 0.2 mol % to 0.6 mol %, or if M is Mg, the amounts of Mg and Al are equal and in a range of 0.1 mol % to 0.25 mol %, A is at least one element selected from a group consisting of Li, K and Na, M is at least one element selected from a group consisting of Ba, Mg and Ca, and R is at least one element selected from a group consisting of lanthanoid and a transition metal element, and may have a grain size distribution corresponding to 6.9 µm≤D50≤13.9 µm.

A red phosphor according to an embodiment may have a grain size distribution corresponding to D90−D50≤14.7 µm.

A red phosphor according to an embodiment may include a nitride-based phosphor represented by an empirical formula $A_z(Sr,M)_2(Si,Al)O_{4-x}N_y:R$ ($0<x<3$, $y=2x/3$, and $0.0001 \leq z<0.1$). Thus, when various illumination apparatuses such as light emitting diodes or the like include the red phosphors, a relatively high level of brightness improved by 20% or more, as compared to red phosphors such as silicate-based phosphors according to the related art, may be provided, while exhibiting excellent thermal and chemical stability. FIG. 1 is a graph illustrating, (T/Q properties), quality properties of a silicate-based phosphor according to the related art and a nitride-based phosphor according to an embodiment of the inventive concept, depending on a temperature.

Figure 2:
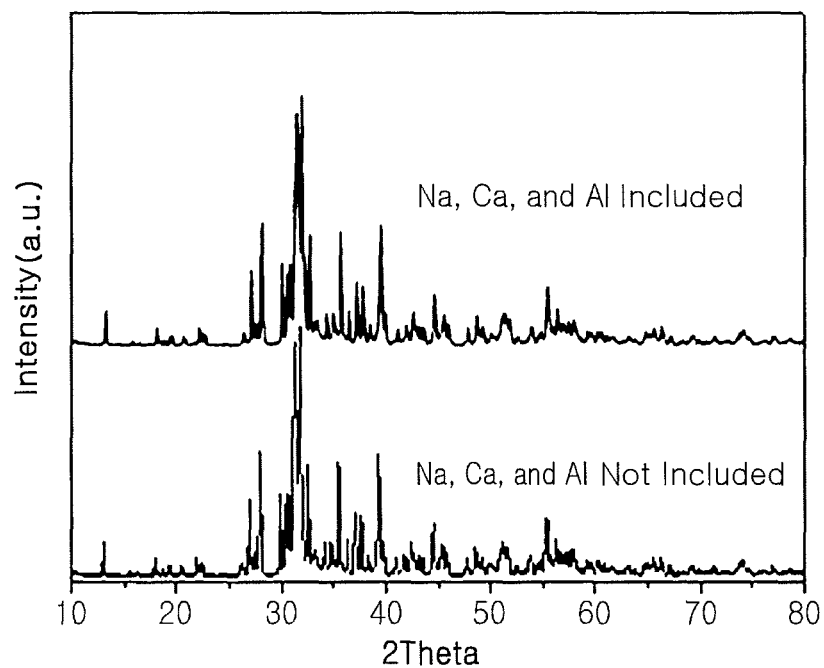
FIG. 2 is a graph illustrating an X-ray diffraction analysis result with respect to crystalline phases of a phosphor according to an embodiment and a nitride-based red phosphor not including sodium, calcium and aluminum.

In the case of the compound represented by the empirical formula $A_z(Sr,M)_2(Si,Al)O_{4-x}N_y:R$ ($0<x<3$, $y=2x/3$, and $0.001<0.0001 \leq z<0.1$), A may be sodium (Na) and M may be calcium (Ca). The sodium and the calcium may be employed in an empty sphere formed in a matrix of the compound so as to serve to improve the brightness of a phosphor while not allowing the sodium and the calcium to affect the form of a matrix formed of a host material in terms of crystalline properties of the compound. FIG. 2 is a graph illustrating an X-ray diffraction analysis result with respect to crystalline phases of a phosphor according to an embodiment and a nitride-based red phosphor not including sodium, calcium and aluminum.

The compound represented by $A_z(Sr,M)_2(Si,Al)O_{4-x}N_y:R$ ($0<x<3$, $y=2x/3$, and $0.0001 \leq z<0.1$) may be produced such that an element containing A therein, an element containing M, and aluminum may respectively serve to perform various roles such as a host material having a crystalline phase, a dopant material, an activator or the like. That is, the compound may be produced through a combination of various configurations so as to improve a performance of a light emitting body.

For example, the compound represented by the empirical formula $A_z(Sr,M)_2(Si,Al)O_{4-x}N_y$:R ($0<x<3$, $y=2x/3$, and $0.0001 \le z<00.1$) may be formed of a host material having a crystalline phase, wherein A may be a dopant material or an activator in the compound. In addition, the compound represented by the empirical formula $A_z(Sr,M)_2(Si,Al)O_{4-x}N_y$:R ($0<x<3$, $y=2x/3$, $0.0001 \le z<0.1$) may be formed of a host material having a crystalline phase, wherein A and the aluminum (Al) may be a dopant material or an activator therein.

R, above, refers to a lanthanoid or an activator, a transition metal element, and may be, for example, europium (Eu) or dysprosium (Dy). The red phosphor including, as an activator, the europium (Eu) or dysprosium (Dy) may emit red light having a light emission peak within a light wavelength band of 600 to 700 nm by using a blue or ultraviolet wavelength region as a source of excitation.

A spectral full width at half maximum of a light emitting wavelength of a red phosphor may range from 83 nm to 150 nm. The red phosphor having the full width at half maximum within the range as above may provide a relatively high color rendering index in a light emitting device such as a white light emitting device or the like.

In addition, the red phosphor may have an orthorhombic crystal structure the same as that of strontium silicate (Sr2SiO4) phosphor according to the related art, and therefore, manufacturing thereof may be easy and thermal stability as well as chemical stability may be provided.

In addition, a method of manufacturing a red phosphor according to an embodiment may be provided. The method of manufacturing a red phosphor may include mixing at least one of a Sr-containing compound and an M-containing compound, an A-containing compound, a Eu-containing compound, an Al-containing compound, and raw materials including a Si-containing oxide and a Si-containing nitride, sintering the compounds and obtaining a compound represented by an empirical formula $A_z(Sr,M)_2(Si,Al)O_{4-x}N_y$:Eu ($0<x<3$, $y=2x/3$, and $0.0001 \le z<0.1$), and crushing and milling the sintered compound.

Here, A is at least one element selected from a group consisting of lithium (Li), potassium (K) and sodium (Na), and M is at least one element selected from a group consisting of barium (Ba), magnesium (Mg) and calcium (Ca).

That is, in the method of manufacturing a red phosphor according to an embodiment, at least one of a Sr-containing compound and an M-containing compound, an A-containing compound, a Eu-containing compound, an Al-containing compound, and raw materials including a Si-containing oxide and a Si-containing nitride may be mixed with each other and then sintered to thus obtain a compound represented by the empirical formula $A_z(Sr,M)_2(Si,Al)O_{4-z}N_y$:Eu ($0<x<3$, $y=2x/3$, $0.0001 \le z<0.1$). The obtained compound may be subjected to a milling process so as to facilitate manufacturing of a red phosphor capable of exhibiting excellent thermal and chemical stability and relatively high brightness.

When the red phosphor is manufactured, although the sintering process and the milling process may only be performed once respectively, these processes may be carried out two or more times. As such, a red phosphor having further improved thermal and chemical stability and light emission performance by allowing the sintering process and the milling process to be performed two or more times may be manufactured.

The Eu-containing compound may be europium oxide ($Eu_2O_3$) and manganese carbonate may be additionally mixed therewith during the process in which the raw materials are mixed. Manganese included in the manganese carbonate may further increase light emission intensity of europium included in the europium oxide, an active material.

The Sr-containing compound may be a compound including various additives facilitating manufacturing of a phosphor, and may include, for example, a metal such as strontium (Sr), a water-soluble metallic salt, an oxide, a nitrate, an oxidizing flame, a sulphate, or a carbonate. In addition, the M-containing compound may include a metal such as M, a water-soluble metallic salt, an oxide, a nitrate, an oxidizing flame, a sulphate, or a carbonate. In addition, as the Si-containing oxide, for example, silicon oxide ($SiO_2$) may be used, and as the Si-containing nitride, for example, silicon nitride ($Si_3N_4$) may be used.

Figure 8:
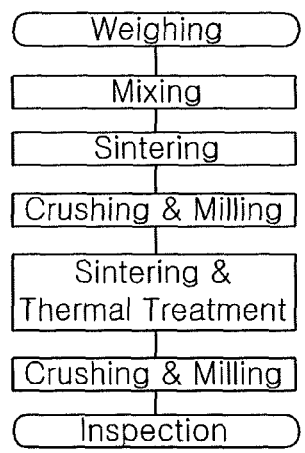
FIG. 8 is a flow chart illustrating a manufacturing procedure of a phosphor according to an embodiment.

On the other hand, in the process in which the raw materials are mixed, a wet mixing process in which raw materials are mixed using a solvent may be performed, and a process in which the wet-mixed raw mixture is dried may be further included therein. In addition, the sintering may be performed within a temperature range of 1000 to 1800° C. for 1 to 24 hours and further, the sintering may be performed under a nitrogen gas atmosphere. FIG. 8 is a flow chart illustrating a manufacturing procedure of a phosphor according to an embodiment.

In addition, a light emitting device according to an embodiment may include a light emitting element emitting excitation light; and a wavelength converting unit absorbing the excitation light to emit visible light. The wavelength converting unit may include a compound represented by an empirical formula $A_z(Sr,M)_2(Si,Al)O_{4-x}N_y$:R ($0<x<3$, $y=2x/3$, and $0.0001 \le z<0.1$), wherein M and Al are optional and, if present, M is Ca or Mg wherein if M is Ca, the amounts of Ca and Al are equal and in a range of 0.2 mol % to 0.6 mol %, or if M is Mg, the amounts of Mg and Al are equal and in a range of 0.1 mol % to 0.25 mol %, A is at least one element selected from a group consisting of lithium (Li), potassium (K) and Sodium (Na), M is at least one element selected from a group consisting of barium (Ba), magnesium (Mg) and calcium (Ca), and R is at least one element selected from a group consisting of lanthanoid and a transition metal element.

A light emitting device according to an embodiment may include a compound represented by an empirical formula $A_z(Sr,M)_2(Si,Al)O_{4-x}N_y$:R ($0<x<3$, $y=2x/3$, and $0.0001 \le z<0.1$) such that white light having properties close to those of natural light may be exhibited by using light in blue and ultraviolet light wavelength bands as sources of excitation while having high output and reliability characteristics.

As the red phosphor, a red phosphor within a light wavelength band of 600 to 700 nm may be used by using blue or ultraviolet light wavelength bands as sources of excitation. In addition, the light emitting element may be widely used as a light emitting source for a light emitting diode, and here, an ultraviolet light emitting diode or a blue light emitting diode providing stable performance while having a relatively low cost may be used.

In addition, the light emitting device may be a white light emitting device and may include at least one type of phosphor selected from a group consisting of a blue phosphor, a green phosphor and a yellow phosphor in a portion of the light emitting device such as a device package. The light emitting device may be manufactured to ultimately output white light.

The wavelength converting unit of the light emitting device may be formed to have various configurations in various locations therein. For example, the wavelength converting unit may be formed above a light emitting element and may have a multi-layer structure configured of at least two phosphor layers including different types of phosphors. In this case, a phosphor included in the wavelength converting unit having a multi-layer structure may be at least one selected from a group consisting of a blue phosphor, a green phosphor and a yellow phosphor, and the light emitting device may ultimately output white light.

The wavelength converting unit may be provided such that an outer surface of the light emitting element is uniformly covered with a resin including the red phosphor. The wavelength converting unit may only be formed, for example, on an upper surface of the light emitting device or on an upper surface and sides thereof.

In addition, the wavelength converting unit may further include a resin encapsulation unit encapsulating the light emitting element, and may be formed to have a structure in which the red phosphors are distributed in the resin encapsulation unit. Here, the wavelength converting unit may include at least two types of phosphors selected from a group consisting of a blue phosphor, a green phosphor and a yellow phosphor, and the light emitting device may ultimately output white light.

Hereinafter, embodiments will be described in detail, and the inventive concept should not be considered as being limited thereto.

Embodiment 1

As a raw material, $SrCO_3$, $SiO_2$, $Eu_2O_3$, and $Si_3N_4$ were mixed with an ethanol solvent at a stoichiometry ratio through ball milling. Thereafter, the ethanol solvent was volatilized from the raw material mixture using a drying apparatus. The dried raw material mixture was inserted into a boron nitride crucible. As doping elements, sodium of 0.01 mol %, calcium of 0.2 mol %, and aluminum of 0.2 mol % were added to the boron nitride crucible so as to be mixed with the raw material mixture.

Then, the boron nitride crucible filled with the raw material mixture and the doping elements was inserted into a heating furnace, and a compound represented by $Na_{0.01}(Sr,Ca)_2(Si,Al)O_{4-x}N_y$:Eu was obtained through a sintering process in which sintering took place under a $N_2$ gas atmosphere at 1600° C. for 10 hours. The compound of $Na_{0.01}(Sr,Ca)_2(Si,Al)O_{4-x}N_y$:Eu was subjected to a milling process in which crushing and milling thereof were performed for 12 hours using a milling machine, and thus, a compound of $Na_{0.01}(Sr,Ca)_2(Si,Al)O_{4-x}N_y$:Eu was re-obtained.

The compound of $Na_{0.01}(Sr,Ca)_2(Si,Al)O_{4-x}N_y$:Eu obtained as above was subjected to the sintering process and the milling process under the same conditions as above, and therefore, a phosphor of $Na_{0.01}(Sr,Ca)_2(Si,Al)O_{4-x}N_y$:Eu was obtained.

Embodiment 2

A phosphor was manufactured through the same method as that of embodiment 1 except for using sodium of 0.01 mol %, calcium of 0.4 mol % and aluminum of 0.4 mol %, as doping elements.

Embodiment 3

A phosphor was manufactured through the same method as that of embodiment 1 except for using sodium of 0.01 mol %, calcium of 0.6 mol % and aluminum of 0.6 mol %, as doping elements.

Comparative Example 1

A phosphor was manufactured through the same method as that of embodiment 1 except that as doping elements, sodium was not used.

X and Y color coordinates, wavelengths, full widths at half maximum, and brightness with regard to the phosphors obtained through the embodiments and the comparative example described above are illustrated in table 1.

TABLE 1

| Items | X Color Coordinate | Y Color Coordinate | Wavelength | Full width at half maximum | Brightness (%) |
|---|---|---|---|---|---|
| Na not included | 0.6278 | 0.3712 | 616 | 83 | 90.49 |
| Na 0.01 mol %, Ca, Al 0.2 mol % | 0.6301 | 0.3700 | 620.6 | 84.2 | 113.46 |
| Na 0.01 mol %, Ca, Al 0.4 mol % | 0.6299 | 0.3699 | 621.5 | 83.9 | 109.54 |
| Na 0.01 mol %, Ca, Al 0.6 mol % | 0.6332 | 0.3659 | 628.9 | 88.7 | 103.21 |

Referring to FIG. 1, it can be appreciated that the phosphors according to the embodiments of the inventive concept have excellent performance as compared with those of the comparative example in terms of wavelength, full width at half maximum, and brightness.

Figure 3:
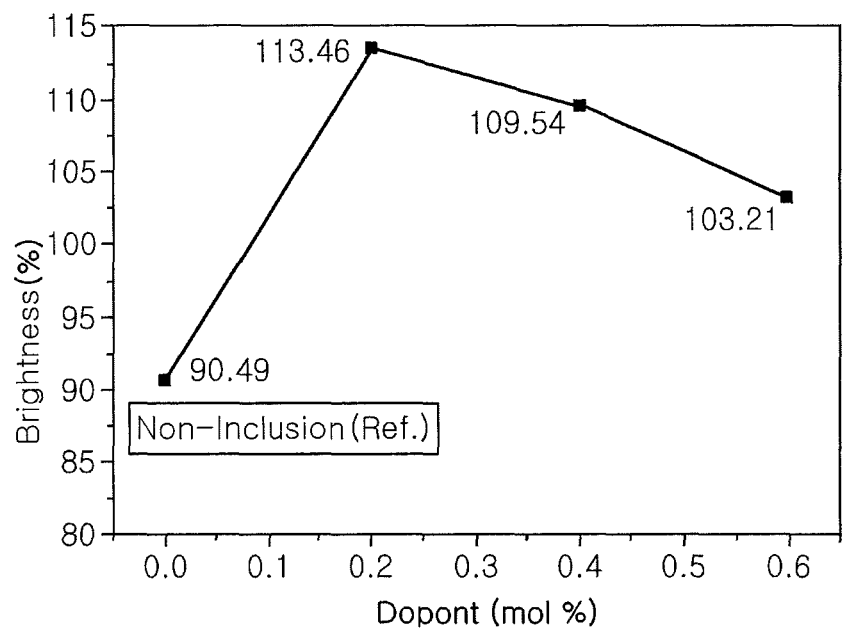
FIG. 3 is a graph illustrating brightness of red phosphors depending on a concentration of a sodium element, a calcium element and an aluminum element.
Figure 4:
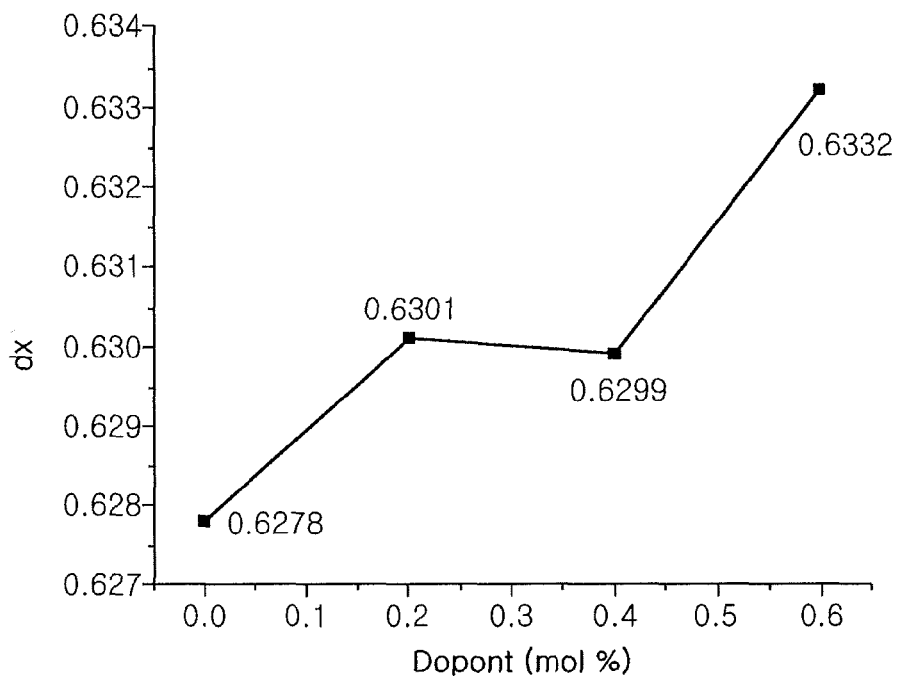
FIG. 4 is a graph illustrating X coordinate values of red phosphors depending on a concentration of a sodium element, a calcium element and an aluminum element.
Figure 5:
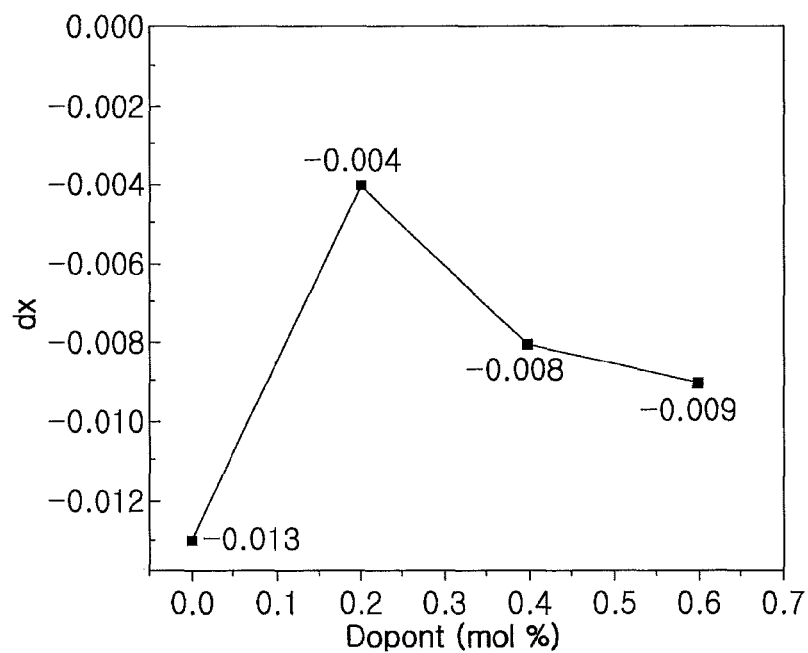
FIG. 5 is a graph illustrating an amount of change in X coordinate values of red phosphors depending on a concentration of a sodium element, a calcium element and an aluminum element.

FIG. 3 is a graph illustrating brightness of red phosphors depending on a concentration of a sodium element, a calcium element and an aluminum element. FIG. 4 is a graph illustrating X coordinate values of red phosphors depending on a concentration of a sodium element, a calcium element and an aluminum element. FIG. 5 is a graph illustrating an amount of change in X coordinate values of red phosphors depending on a concentration of a sodium element, a calcium element and an aluminum element.

Figure 6:
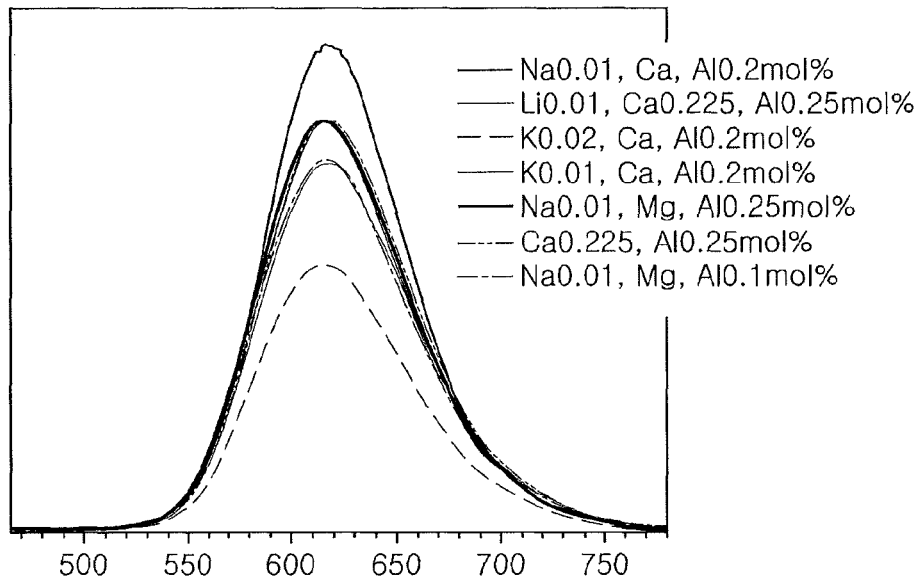
FIG. 6 is a graph illustrating brightness characteristics of phosphors including doping elements of lithium, potassium and magnesium.

FIG. 6 is a graph illustrating brightness characteristics of phosphors including doping elements of lithium, potassium and magnesium. With reference to FIG. 6, it can be appreciated that the phosphors respectively including lithium and potassium exhibit low brightness of 50% or less as compared to embodiment 1 according to the embodiment, and the phosphor including magnesium exhibits low brightness of 60% or less as compared to embodiment 1 according to the embodiment.

Figure 7:
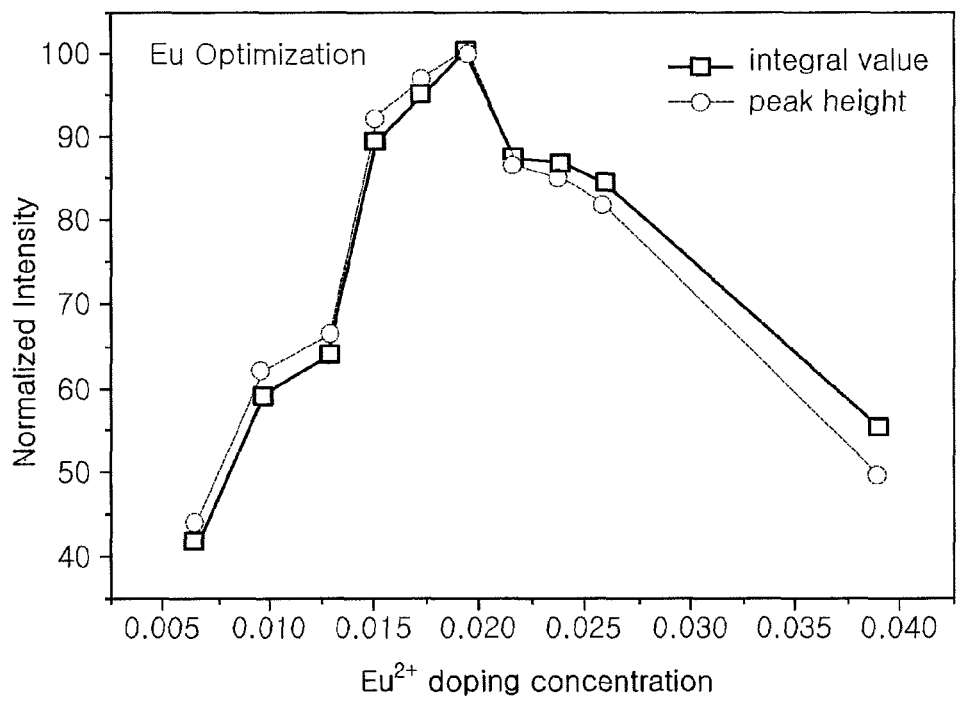
FIG. 7 is a graph illustrating light emission efficiency of a phosphor depending on a europium (Eu) element concentration.

FIG. 7 is a graph illustrating light emission efficiency of a phosphor depending on a europium (Eu) element concentration.

Hereinafter, embodiments of the inventive concept will be described in detail with reference to the accompanying drawings, but the inventive concept should not be considered as being limited thereto.

Figure 9:
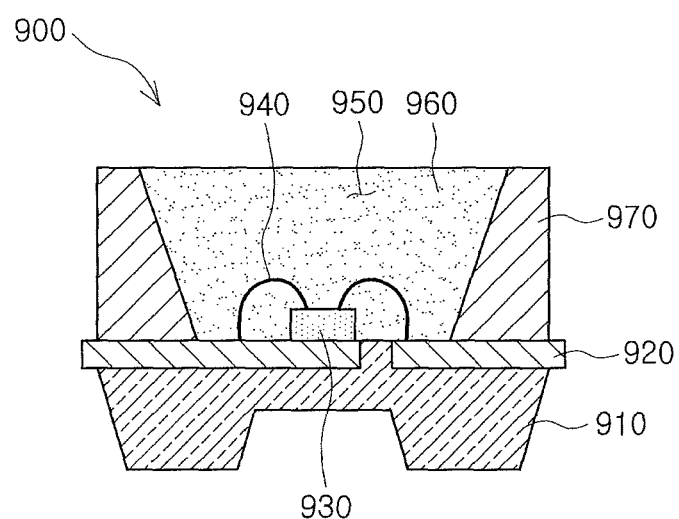
FIG. 9 is a cross-sectional side view of a light emitting device package according to an embodiment.

FIG. 9 is a cross-sectional side view of a light emitting device package according to an embodiment. As shown in FIG. 9, a light emitting device package 900 may include a package body 910, lead frames 920 molded in the package body 910 to be spaced apart from each other, a light emitting device 930 mounted on the at least one lead frame, a bonding wire 940 electrically connecting the light emitting device 930 to the lead frame 920, and a resin encapsulation unit 950 encapsulating the light emitting device 930. In the light emitting device package 900, a reflective cup 970 having a groove part formed therein to encompass the light emitting device 930 may be formed on an upper part of the package body based on a position in which the lead frame is located.

In this case, the reflective cup 970 may be formed in a circular form on the package body, a mounting region of the light emitting device 930 may be defined by the groove part of the reflective cup, and at least one lead frame may be exposed to a bottom of the groove part to provide the mounting region. In addition, a side wall of the reflective cup may be configured as an inclined reflective surface to reflect light emitted from the light emitting device 930 in a direction to be required. Here, the package body 910 may be integrated with the reflective cup 970.

In addition, the light emitting device 930 may be bonded to an upper part of the lead frame 920 using an adhesive or the like and may receive a current from an external power source through the bonding wire 940 to then emit a predetermined wavelength of light. The light emitting device 930 described above may emit light having a wavelength ranging from 200 to 500 nm, and may be, for example, an ultraviolet light emitting diode or a blue light emitting diode having a semiconductor stacking structure and emitting ultraviolet light or blue light.

In addition, the resin encapsulation unit 950 may fill an inside of the reflective cup so as to cover the light emitting device 930, the bonding wire 940 and the lead frame 920. Further, the resin encapsulation unit 950 may include a phosphor 960 converting a wavelength of light emitted from the light emitting device into a different wavelength of light.

The phosphor 960 may be used by mixing a red phosphor with at least one of a green phosphor, a blue phosphor and a yellow phosphor so as to emit white light. That is, the resin encapsulation unit 950 may be used by appropriately mixing a phosphor mixture with a curable transparent resin such as an epoxy resin, a silicon resin or a silicon epoxy mixture resin.

Here, as the red phosphor used in order to emit white light from the light emitting device, a nitride-based red phosphor including a compound represented by an empirical formula $A_z(Sr,M)_2(Si,Al)O_{4-x}N_y:R$ ($0<x<3$, $y=2x/3$, $0.001<z<0.1$) and provided according to the above-mentioned embodiments 1 to 3 may be used, wherein A is at least one element selected from a group consisting of lithium (Li), potassium (K) and sodium (Na), and M is at least one element selected from a group consisting of Barium (Ba), magnesium (Mg) and calcium (Ca), and R is at least one element selected from a group consisting of lanthanoid and a transition metal element. The nitride-based red phosphor may have excellent reliability in terms of external environmental factors such as heat, moisture, and the like as compared to those of a sulfide-based phosphor and may also have relatively low possibility that discoloration thereof will occur. In addition, relatively high phosphor excitation efficiency may be provided in a dominant wavelength of light from the blue LED chip, defined as within a range of, for example, 430 to 465 nm in order to obtain high color reproducibility.

In addition, as the blue phosphor, $(Ba,Sr,Ca)_5(PO_4)_3Cl:(Eu^{2+},Mn^{2+})$ or $Y_2O_3:(Bi^{3+},Eu^{2+})$ may be selectively used. A green phosphor may include any one of a silicate-based phosphor, a sulfide-based phosphor and a nitride-based phosphor. The silicate-based green phosphor may include any one of a silicate-based phosphor having a composition of $A_2SiO_4$ of 2:1:4, a silicate-based phosphor having a composition of $A_3SiO_5$ of 3:1:5, a sulfide-based phosphor having a composition of $SrGa_2S_4:Eu$, and a nitride-based phosphor having a composition of Beta-SiAlON. Here, A may be Sr, Ba, Ca, or Mg. Sr may be an essential component, and Ba, Ca, and Mg may be selectively included therein as needed ($0 \leq Ba, Ca, Mg \leq 1$).

As the nitride-based green phosphor, a phosphor including a crystal of nitride or oxynitride in which europium (Eu) is employed among crystals having a crystal structure of β-type $Si_3N_4$ and represented by $Si_{6-z}Al_zO_zN_{8-z}:Eu_y,Sr_x$ ($0.009<x<0.011$, $0.018<y<0.025$, and $0.23<z<0.35$) or $Si_{6-z}Al_zO_zN_{8-z}$ ($0.24 \leq y \leq 0.42$, and the content of Eu ranging from 0.05 at % to 0.25 at %) may be used therein. In the case of the yellow phosphor, any one of a YAG or TAG garnet-based phosphor, a silicate-based phosphor having a composition of $A_2SiO_4$ of 2:1:4, a silicate-based phosphor having a composition of $A_3SiO_5$ of 3:1:5, and a nitride-based phosphor having a composition of α-SiAlON may be used therein (Here, A may be Sr, Ba, Ca or Mg, Sr may be an essential component, Ba, Ca and Mg may be selectively used as needed ($0 \leq Ba, Ca, and Mg \leq 1$)).

As the nitride-based phosphor, a Ca-α-SiAlON phosphor represented by $Ca_xSi_{12-(m+2)}Al_{(m+n)}O_nN_{16-n}:Eu_y$ ($0.01<y<0.7$, $0.6<m<3.0$ and $0 \leq n<1.5$) may be used.

On the other hand, in the case of the red phosphor according to an embodiment of the inventive concept, color scattering may be reduced by appropriately adjusting a grain size distribution of phosphor powder when it is applied to a package, and light emission efficiency may be improved. Color scattering and brightness on a package level, depending on a grain size of phosphor powder particle, that is, a diameter distribution of particles, according to an embodiment of the inventive concept were tested, and the red phosphor powder particles were classified through a classification process performed three times as illustrated in table 2 below. In this case, a method of adjusting a phosphor particle size may be performed before or after a raw material is prepared or a sintering process is performed, and a publicly known classification method may be appropriately used using equipment such as an SC-mill, z-mill, or the like.

TABLE 2

| | D10 (μm) | D50 (μm) | D90 (μm) |
|---|---|---|---|
| Primary Classification | 19.2 | 30.2 | 41.1 |
| Secondary Classification | 8.8 | 13.9 | 28.6 |
| Third Classification | 4.5 | 6.9 | 10.1 |

Figure 10:
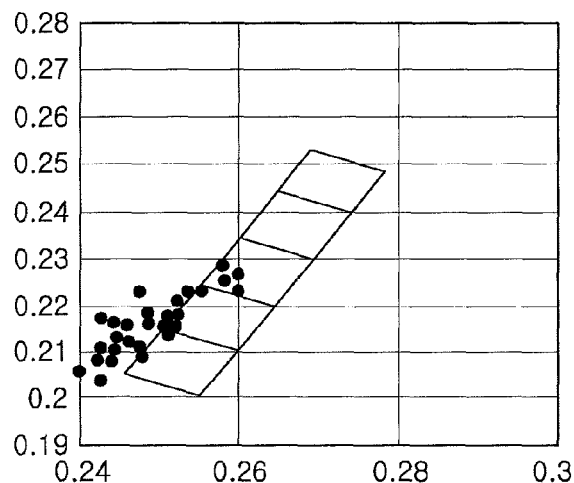
FIGS. 10 and 11 are color coordinate graphs illustrating a change in a color distribution, depending on a grain size distribution of red phosphors according to an embodiment.
Figure 11:
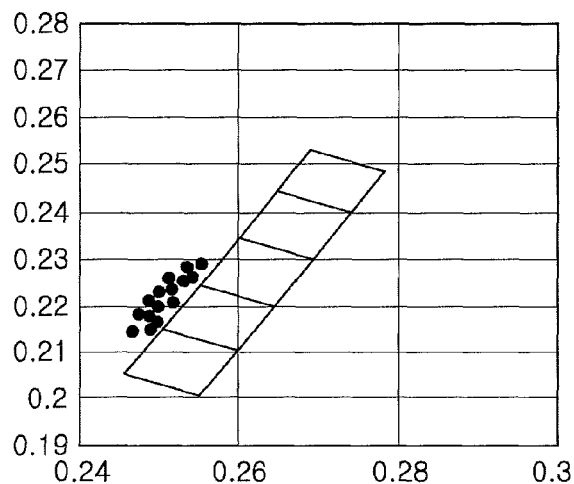

In table 2 above, in the case of a particle diameter distribution, D50 refers to 50% in an integration fraction, and D10 and D90 refer to 10% and 90%, respectively. A package having a structure similar to that shown in FIG. 9 was manufactured using the phosphor powder having the grain size distribution based on the classification process performed three times. FIGS. 10 and 11 are color coordinate graphs illustrating a change in a color distribution, depending on a grain size distribution of red phosphors according to an embodiment. In this case, in order to perform measurement thereof with respect to the color coordinates, a green phosphor was used together with the phosphor having the distribution as above, and as a source of excitation, a blue LED was used. In addition, in the case of the green phosphor, a grain size distribution similar to that of the red phosphor used together therewith was included therein.

FIG. 10 illustrates a color coordinate distribution of a package using a phosphor exhibiting a grain size distribution corresponding to the primary classification in table 2 above. FIG. 11 illustrates a color coordinate distribution of a package using phosphors exhibiting grain size distributions corresponding to the secondary and third classification in table 2 above. Comparing FIGS. 10 and 11, it can be appreciated that when the grain size is relatively small and a grain size deviation is relatively low (the phosphors provided through the secondary and third classification), color scattering is reduced.

Figure 12:
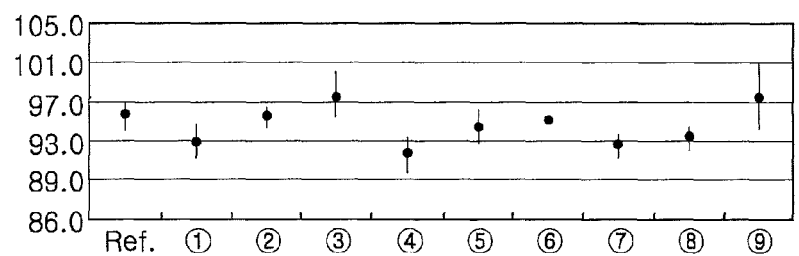
FIG. 12 illustrates a change in brightness depending on a grain size distribution of a red phosphor according to an embodiment.

FIG. 12 illustrates a change in brightness depending on a grain size distribution of a red phosphor. With respect to respective experimental examples, first, in the case of a reference example (Ref.), as a CaSiN red phosphor according to the related art, the grain size distribution was adjusted to be similar to that of the secondary classification, and a green phosphor, for example, a SiAlON-based phosphor, having a grain size distribution similar thereto was also used. In all of experimental examples 1 to 9 (①  to ⑨), the red phosphors were used, and in the case of experimental example 1 (①), the red phosphor having a relatively large grain size (the primary classification) and the green phosphor having a grain size distribution similar thereto (similar to that in the primary classification) were used. In the case of experimental example 2 (②), the red phosphor having an intermediate grain size (the secondary classification) and the green phosphor having a relatively large grain size distribution (similar to that of the primary classification) were used. In the case of experimental example 3 (②), the red phosphor having a relatively small grain size (the third classification) and the green phosphor having a relatively large grain size distribution (similar to that of the primary classification) were used.

With reference to experimental examples 1 to 3 (① to ③), it can be appreciated that when a grain size is reduced, brightness is relatively excellent. Therefore, it may be considered that when a grain size is relatively small and a phosphor particle size is uniform, degradation of light emission efficiency due to light scattering may be reduced.

Subsequently, in the case of experimental example 4 (④), the red phosphor having a relatively large grain size (the primary classification) and the green phosphor having an intermediate grain size distribution (similar to that of the secondary classification) were used. In the case of experimental example 5 (⑤), the red phosphor having an intermediate grain size (the secondary classification) and the green phosphor having an intermediate grain size distribution (similar to that of the secondary classification) were used. In the case of experimental example 6 (⑥), the red phosphor having a relatively small grain size (the third classification) and the green phosphor having a relatively small grain size distribution (similar to that of the secondary classification) were used. In the case of experimental example 7 (⑦), the red phosphor having a relatively large grain size (the primary classification) and the green phosphor having a relatively small grain size distribution (similar to that of the third classification) were used. In the case of experimental example 8 (⑧), the red phosphor having an intermediate grain size (the secondary classification) and the green phosphor having a relatively small grain size distribution (similar to that of the third classification) were used. In the case of experimental example 9 (⑨), the red phosphor having a relatively small grain size (the third classification) and the green phosphor having a relatively small grain size distribution (similar to that of the secondary classification) were used.

In the case of experimental examples of 4 to 9 (④ to ⑨), when the grain size and the grain size deviation of the red phosphors were relatively low regardless of the size of a different phosphor, the trend for an increase in the brightness of the red phosphor obtained through the secondary and third classification was also shown.

Based on the experimental results as above, in the case of the red phosphor proposed according to the embodiment of the inventive concept, the phosphor may have the grain size distribution of 6.9 μm≤D50≤13.9 μm corresponding to the secondary and third classification. In addition, in terms of the grain size deviation, the phosphor may have the grain size distribution of D90−D50≤14.7 μm corresponding to the example of the secondary classification.

While the present invention has been shown and described in connection with the embodiments, it will be apparent to those skilled in the art that modifications and variations can be made without departing from the spirit and scope of the invention as defined by the appended claims.

The invention claimed is:

1. A red phosphor comprising:
a compound represented by an empirical formula $A_z(Sr,M)_2(Si,Al)O_{4-x}N_y$:R (0<x<3, y=2x/3, and 0.0001≤z≤0.1), wherein M and Al are optional and, if present, M is Ca or Mg wherein if M is Ca, the amounts of Ca and Al are equal and in a range of 0.2 mol % to 0.6 mol %, or if M is Mg, the amounts of Mg and Al are equal and in a range of 0.1 mol % to 0.25 mol %, A is at least one element selected from a group consisting of lithium (Li), potassium (K) and sodium (Na), and R is at least one element selected from a group consisting of lanthanoid and a transition metal element; and
a grain size distribution corresponding to 6.9 μm≤D50≤13.9 μm.

2. The red phosphor of claim 1, wherein the red phosphor has a grain size distribution corresponding to D90−D50≤14.7 μm.

3. The red phosphor of claim 1, wherein A is sodium (Na) and M is calcium (Ca).

4. The red phosphor of claim 1, wherein the compound represented by the empirical formula $A_z(Sr,M)_2(Si,Al)O_{4-x}N_y$:R (0<x<3, y=2x/3, and 0.0001≤z≤0.1) is formed of a host material having a crystalline phase, and A is a dopant material or an activator in the compound.

5. The red phosphor of claim 1, wherein the compound represented by the empirical formula $A_z(Sr,M)_2(Si,Al)O_{4-x}N_y$:R (0<x<3, y=2x/3, and 0.0001≤z≤0.1) is formed of a host material having a crystalline phase, and the A and the aluminum are dopant materials or activators in the compound.

6. The red phosphor of claim 1, wherein the red phosphor has a light emission peak in a light wavelength band of 600 nm to 700 nm by using a blue or ultraviolet wavelength region as a source of excitation.

7. The red phosphor of claim 1, wherein R is europium (Eu) or dysprosium (Dy).

8. The red phosphor of claim 1, wherein a spectral full width at half maximum of a light emission wavelength of the red phosphor ranges from 83 to 150 nm.

9. The red phosphor of claim 1, wherein the red phosphor has an orthorhombic crystal structure.

10. A light emitting device comprising:
a light emitting element emitting excitation light; and
a wavelength converting unit absorbing the excitation light to emit visible light, wherein the wavelength converting unit includes a compound represented by an empirical formula $A_z(Sr,M)_2(Si,Al)O_{4-x}N_y$:R (0<x<3, y=2x/3, and 0.0001≤z<0.1), and has a grain size distribution corresponding to 5 μm≤D50≤14 μm, wherein M and Al are optional and, if present, M is Ca or Mg wherein if M is Ca, the amounts of Ca and Al are equal and in a range of 0.2 mol % to 0.6 mol %, or if M is Mg, the amounts of Mg and Al are equal and in a range of 0.1 mol % to 0.25 mol %, A is at least one element selected from a group consisting of lithium (Li), potassium (K) and Sodium (Na), and R is at least one element selected from a group consisting of lanthanoid and a transition metal element.

11. The light emitting device of claim 10, comprising a grain size distribution corresponding to D90−D50≤15 μm.

12. The light emitting device of claim 10, wherein the light emitting element is an ultraviolet light emitting diode or a blue light emitting diode.

13. The light emitting device of claim 10, wherein the light emitting device includes at least one type of phosphor selected from a group consisting of a blue phosphor, a green phosphor and a yellow phosphor, and the light emitting device ultimately outputs white light.

14. The light emitting device of claim 10, wherein the wavelength converting unit is formed above the light emitting element and has a multi-layer structure configured of at least two phosphor layers including different types of phosphors.

15. The light emitting device of claim 14, wherein the phosphor is at least one selected from a group consisting of a blue phosphor, a green phosphor and a yellow phosphor, and the light emitting device ultimately outputs white light.

16. The light emitting device of claim 10, wherein the wavelength converting unit is formed such that an outer surface of the light emitting element is uniformly covered with a resin including the red phosphor.

17. The light emitting device of claim 16, wherein the wavelength converting unit is only formed on an upper surface of the light emitting element or formed on an upper surface and sides thereof.

18. The light emitting device of claim 10, wherein the wavelength converting unit further includes a resin encapsulation unit encapsulating the light emitting element, and the red phosphors are distributed in the resin encapsulation unit.

19. The light emitting device of claim 18, wherein the wavelength converting unit includes at least two types of phosphors selected from a group consisting of a blue phosphor, a green phosphor and a yellow phosphor, and the light emitting device ultimately outputs white light.

* * * * *